United States Patent
Chan et al.

(10) Patent No.: US 10,498,943 B2
(45) Date of Patent: Dec. 3, 2019

(54) OPTOELECTRONIC MODULES INCLUDING OVERMOLD SUPPORTING AN OPTICAL ASSEMBLY

(71) Applicant: ams Sensors Singapore Pte. Ltd., Singapore (SG)

(72) Inventors: Sai Mun Chan, Singapore (SG); Hartmut Rudmann, Jona (CH); Tae Yong Ahn, Singapore (SG); Kyu Won Hwang, Singapore (SG)

(73) Assignee: AMS SENSORS SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/742,567

(22) PCT Filed: Jun. 29, 2016

(86) PCT No.: PCT/SG2016/050304
§ 371 (c)(1),
(2) Date: Jan. 8, 2018

(87) PCT Pub. No.: WO2017/007425
PCT Pub. Date: Jan. 12, 2017

(65) Prior Publication Data
US 2018/0205857 A1    Jul. 19, 2018

Related U.S. Application Data

(60) Provisional application No. 62/190,525, filed on Jul. 9, 2015, provisional application No. 62/208,949, filed
(Continued)

(51) Int. Cl.
*H04N 5/225* (2006.01)
*H01L 27/146* (2006.01)
(Continued)

(52) U.S. Cl.
CPC ........... *H04N 5/2257* (2013.01); *G02B 7/021* (2013.01); *G02B 7/028* (2013.01); *G02B 7/04* (2013.01);
(Continued)

(58) Field of Classification Search
CPC .................................................... H04N 5/2257
(Continued)

(56) References Cited

U.S. PATENT DOCUMENTS

2005/0146001 A1   7/2005   Shiu et al.
2009/0130791 A1*  5/2009   Kwon ............... H01L 27/14618
                                                              438/65
(Continued)

FOREIGN PATENT DOCUMENTS

WO        2015/038064        3/2015

OTHER PUBLICATIONS

International Search Report issued by ISA/AU for PCT/SG2016/050304 (dated Aug. 29, 2016).

*Primary Examiner* — Usman A Khan
(74) *Attorney, Agent, or Firm* — Michael Best & Friedrich LLP (57) ABSTRACT

Optoelectronic modules include overmolds that support an optical assembly and, in some case, protect wiring providing electrical connections between an image sensor and a printed circuit board (PCB) or other substrate. The disclosure also describes wafer-level fabrication methods for making the modules.

13 Claims, 11 Drawing Sheets

Related U.S. Application Data on Aug. 24, 2015, provisional application No. 62/272,976, filed on Dec. 30, 2015.

(51) Int. Cl.

| | |
|---|---|
| *G02B 7/02* | (2006.01) |
| *G02B 13/00* | (2006.01) |
| *G02B 7/04* | (2006.01) |
| *H01L 21/56* | (2006.01) |
| *H01L 23/00* | (2006.01) |
| *H04N 5/232* | (2006.01) |

(52) U.S. Cl.
CPC ........ *G02B 13/0085* (2013.01); *H01L 21/561* (2013.01); *H01L 21/566* (2013.01); *H01L 24/48* (2013.01); *H01L 24/85* (2013.01); *H01L 27/14618* (2013.01); *H01L 27/14625* (2013.01); *H01L 27/14636* (2013.01); *H04N 5/2253* (2013.01); *H04N 5/2254* (2013.01); *H04N 5/23212* (2013.01); *H01L 2224/48091* (2013.01); *H01L 2224/48225* (2013.01); *H01L 2224/8592* (2013.01); *H01L 2224/97* (2013.01)

(58) Field of Classification Search
USPC .......................................................... 348/373
See application file for complete search history.

(56) References Cited

U.S. PATENT DOCUMENTS

| | | | |
|---|---|---|---|
| 2011/0156187 A1 | 6/2011 | Tu et al. | |
| 2011/0254999 A1* | 10/2011 | Sugiyama | G03B 21/16 348/373 |
| 2011/0274301 A1* | 11/2011 | Peck | H04R 1/44 381/190 |
| 2013/0320471 A1* | 12/2013 | Luan | H01L 27/14618 257/432 |
| 2016/0218239 A1 | 7/2016 | Gubser et al. | |
| 2017/0012069 A1 | 1/2017 | Rudmann et al. | |

* cited by examiner

OPTOELECTRONIC MODULES INCLUDING OVERMOLD SUPPORTING AN OPTICAL ASSEMBLY

FIELD OF THE DISCLOSURE

This disclosure relates to optoelectronic modules including an overmold supporting an optical assembly.

BACKGROUND

Some optoelectronic modules include image sensors that can be used in cameras and other imaging devices to capture images. For example, light entering through an aperture at one end of the imaging device is directed to an image sensor by a beam shaping system. The image sensors include pixels that generate signals in response to sensing received light.

In order to protect wiring that provides electrical connections between the image sensor and a printed circuit board on which it is mounted, high-viscosity epoxy sometimes is used to build a dam around the sensor so as to encapsulate the wires. However, in some instances the dam walls collapse, thereby revealing the wires or allowing the liquid epoxy to contaminate the sensor's surface. Further, such processes generally require particular kinds of epoxies, which tend to absorb water from a moist atmosphere. The absorption of moisture can lead to undesirable changes in the dimensions of the module, such as its focal length.

SUMMARY

The present disclosure describes optoelectronic modules that include an overmold supporting an optical assembly. In some cases, the overmold also can protect wiring that provides electrical connections between an image sensor and a printed circuit board (PCB) or other substrate. The disclosure also describes wafer-level fabrication methods for making the modules.

In general, according to one aspect, wafer-level methods of fabricating optoelectronic modules include providing a support wafer having a multitude of image sensors mounted thereon and including electrical connections between the image sensor and electrical contacts on the support wafer. The method includes forming an overmold that encases the electrical connections. A respective optical assembly is attached over each image sensor. A first surface of the optical assembly is in direct contact with a surface of the image sensor, and a second surface of the optical assembly is in contact, by way of adhesive, with a surface of the overmold. The support wafer then is separated so as to form individual modules each of which includes one of the optical assemblies over a respective one of the image sensors.

In some implementations, the overmold is composed of a resin having less than 0.1% water absorption.

In some instances, forming the overmold includes bringing a mold tool into contact with a surface of the image sensors, where the mold tool includes a cushion-type layer that contacts the surface of the image sensors. A molding resin is provided in cavities between the mold tool and the support wafer.

In another aspect, an optoelectronic module includes an image sensor mounted on a substrate, and electrical connections coupling the image sensor to electrical contacts on the substrate. An overmold laterally encircles the image sensor and is in contact with a side edge of the image sensor. An optical assembly is disposed over the image sensor and is attached to an optical assembly-side surface of the overmold. The module includes means establishing a specified distance between the image sensor and an optical element in the optical assembly.

The means establishing the specified distance can take any one of various forms. For example, in some instances, the optical assembly includes a spacer having a first surface in direct contact with the optical assembly-side surface of the image sensor and having a second surface in contact, by way of adhesive, with the optical assembly-side surface of the overmold. The first surface can be machined, as needed, prior to attaching the optical assembly to the overmold so as to provide the specified distance. In some implementations, the optical assembly includes a threaded lens barrel operable to adjust the distance between the image sensor and an optical element in the optical assembly. Further, in some implementations, the optical assembly includes an autofocus lens barrel operable to adjust the distance between the image sensor and an optical element in the optical assembly.

In some cases, the overmold partially overlaps an upper surface of the image sensor at a periphery of the image sensor.

In some implementations, the overmold is composed of a resin having less than 0.1% water absorption.

One or more of the following advantages are present in some implementations, For example, the overmold can help support the optical assembly and can help provide structural integrity to the module. When wiring is provided for electrical connections between the image sensor and the support substrate (e.g., printed circuit board), the overmold can encase the wiring, thereby providing protection. In some cases, the overmold helps avoid problems that otherwise may occur as a result of the absorption of moisture from the atmosphere. Further, using molding techniques to form the resin structure (rather than the injection or jetting techniques used with high-viscosity epoxies) allows a resin overmold to be placed in close proximity to the sensor. In some cases, the resin overmold partially covers the sides of the sensor near its periphery so as to encapsulate the sensor's wire contacts. The molds thus can facilitate positioning the molding resin precisely where it is needed (e.g., partly on the surface of the sensor near its periphery). Further, the described processes permit, in some implementations, the overmold to be in very close proximity to the active parts of the image sensor (e.g., the accuracy can be +/−5 μm in some instances).

Other aspects, features and advantages will be readily apparent from the following detailed description, the accompanying drawings and the claims.

DETAILED DESCRIPTION

Figure 1:
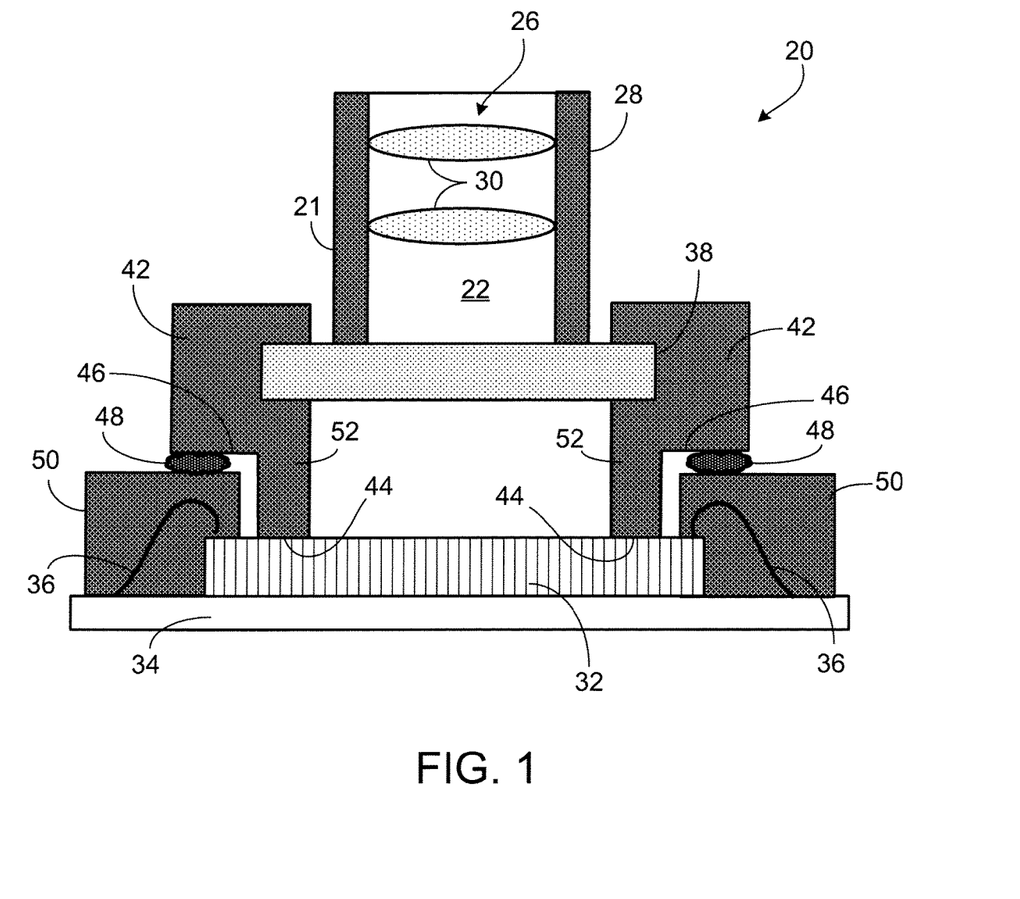
FIG. 1 illustrates an example of an optoelectronic module.

FIG. 1 illustrates an example of an opto-electronic module 20 for a compact array camera or other imaging device that includes an optical channel 22 which has a beam shaping system such as a lens stack 26 held by a lens barrel 28. The lens barrels 28 can be composed, for example, of an injection molded epoxy material. In the illustrated example, the lens stack 26 includes multiple lens elements 30 stacked one over the other and intersecting the optical axis of the channel 22. In some implementations, only a single beam shaping element (e.g., lens) may be provided for each optical channel. The lens stack 26 is substantially aligned with a monolithic image sensor 32, which can be implemented, for example, as a CCD or CMOS pixel array that is operable to sense light (e.g., IR, visible, or UV) of a particular wavelength or range of wavelengths. Further, the image sensor 32, which is an example of an active optoelectronic component, can be implemented as part of an integrated circuit (IC) formed, for example, as a semiconductor chip device that includes circuitry to perform processing (e.g., analog-to-digital processing) of signals produced by the light sensing elements. The sensor 32 can be mounted, for example, on a substrate such as a printed circuit board (PCB) 34. Wiring (i.e., electrically conductive connections) 36 can be provided from the sensor 32 to electrical contacts on the PCB 34. The wiring 36 is encased within an overmold 50 that laterally surrounds the image sensor 32.

The overmold 50 can be composed of low water-absorption resin (e.g., <0.1% water absorption). The overmold 50 can help safeguard the wiring 36 from mechanical failures. Preferably, the low water-absorption resin is substantially nontransparent to light (e.g., opaque to light having the same wavelength(s) of light that the image sensor is sensitive to). The low water-absorption resin permits the overmold 50 to be dimensionally stable even when subject to relatively high temperatures, such as may be used during reflow processes.

As further illustrated in the example of FIG. 1, the lens barrels 28 can be mounted directly or indirectly on a transparent cover 38 that is disposed between the lens stack 26 and the sensor 32. The transparent cover 38 can be shaped, for example, as a plate whose thickness is substantially uniform. The cover 38, which can protect the sensor 32 from dirt and the like, is substantially transparent to the wavelength(s) of light detectable by the sensor 32. In some instances, the cover 38 is composed of a glass or plastic material. Providing a transparent cover 38 over the sensor 32 can help improve the mechanical stability of the module 20 and can help reduce the extent of thermal expansion in the module. In some instances, the lens stack-side of the cover 38, for example, can be partially coated with black chrome to prevent stray light from being received by the sensor 32. The black chrome can be deposited on the surface of the cover 38 other than on areas corresponding to the optical channel 22.

The sensor 32 can be positioned at a defined distance from the transparent cover 38 (and thus from the lens stack 26). To achieve the desired distance, a spacer 42 separates the transparent cover 38 from upper surface of the sensor 32. In the illustrated example of FIG. 1, the lateral side edges of the transparent cover 38 are embedded within the spacer 42. The spacer 42 includes a height-defining surface 44 that is in direct contact with the surface of the image sensor 32 and thus determines the distance between the image sensor 32 and the transparent cover 38 (as well as the distance between the image sensor 32 and the lens stack 26). The spacer 42 further includes a bonding surface 46 that is fixed to the upper surface of the overmold 50, for example, by way of adhesive 48. In the illustrated example, the bonding surface 46 is further than the height-defining surface 44 from the top surface of the image sensor 32. The height of the adhesive 48 between the overmold 50 and the spacer 42 is adaptable such that the adhesive conforms to the height defined by the height-defining portion 52 of the spacer 42. Thus, in addition to encasing the wiring 36, the overmold 50 provides a mechanical support for the spacer 42.

The spacer 42 can be formed, for example, as a single monolithic piece and can be composed, for example, of a vacuum injection molded epoxy material that is substantially opaque for the wavelength(s) of light detectable by the image sensor 32. In some cases, the lens barrel 28 is composed of the same material as the spacer 42. The spacer has an opening (i.e., a through-hole) 46 that serves as a light conduit of the channel 22 to allow light to pass from the lens stacks 26 through the transparent cover 38 and to the sensor 32.

In some implementations, optical filters are provided, for example, on the transparent cover 38 or on the image sensor 32. Various types of optical filters can be used, such as monochromatic, Bayer or other color filter arrays, neutral density, or infra-red (IR). Depending on the implementation, the filters for each channel may be the same or may differ.

A wafer-level process can be used to fabricate multiple modules 20 at the same time. Generally, a wafer refers to a substantially disk- or plate-like shaped item, its extension in one direction (z-direction or vertical direction) is small with respect to its extension in the other two directions (x- and y-, or lateral, directions). In some implementations, the diameter of the wafer is between 5 cm and 40 cm, and can be, for example, between 10 cm and 31 cm. The wafer may be cylindrical with a diameter, for example, of 2, 4, 6, 8, or 12 inches, one inch being about 2.54 cm. In some implementations of a wafer level process, there can be provisions for at least ten modules in each lateral direction, and in some cases at least thirty or even fifty or more modules in each lateral direction.

Figure 2A:
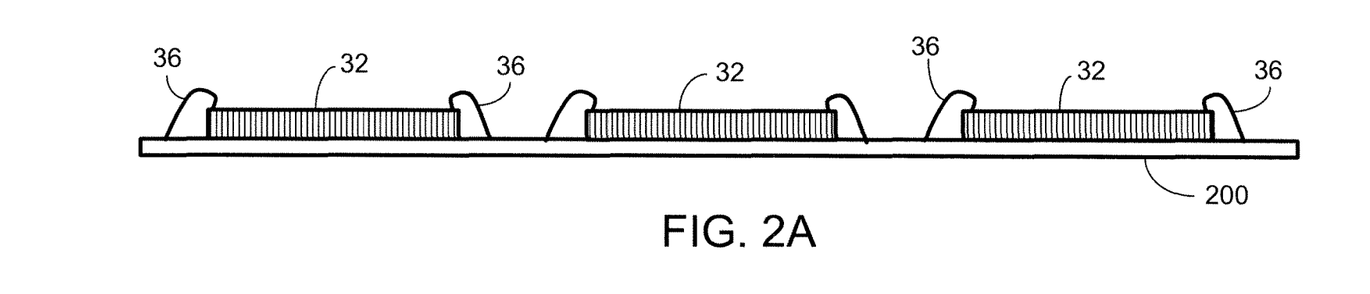
FIGS. 2A-2G illustrate steps in a wafer-level fabrication process for making optoelectronic modules as in FIG. 1.

An example of a wafer-level process for making multiple modules 20 is described below in connection with FIGS. 2A-2G. As shown in FIG. 2A, multiple image sensor dies 32 are mounted on a support wafer, such as a PCB wafer 200. Wiring bonds 36 are provided for electrical connection between the dies 32 and the PCB wafer 200.

Figure 2B:
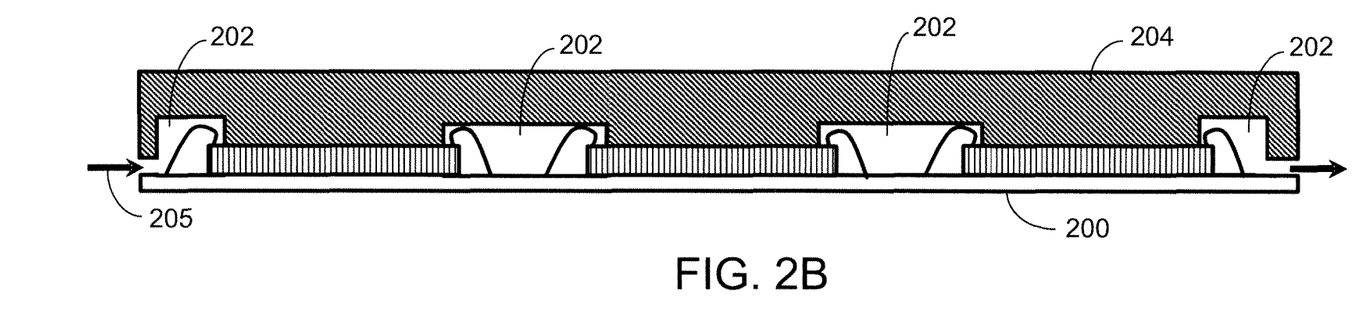
Figure 2C:
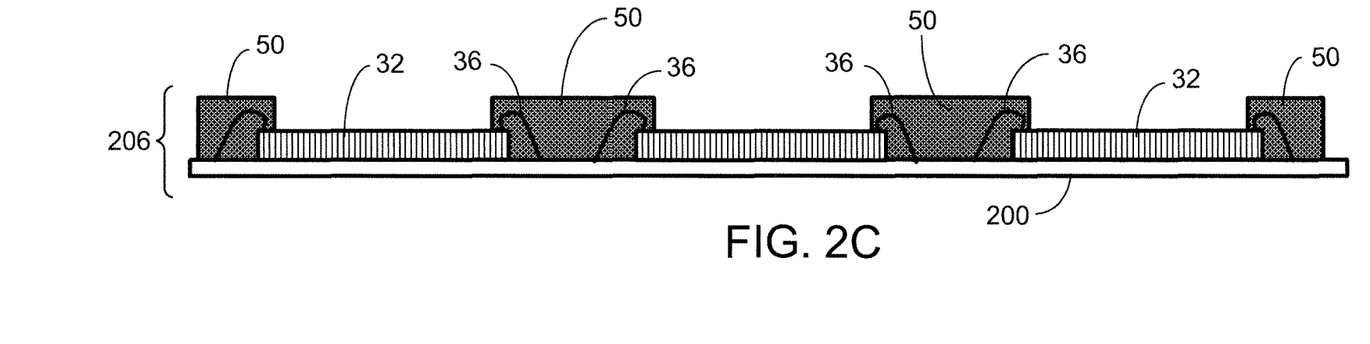

Next, as indicated by FIGS. 2B and 2C, overmolds 50 are formed, for example, by a vacuum injection technique. In some implementations, a vacuum injection tool 204 is brought into contact with the upper surface of the image sensor dies 32. The tool 204 has cavities 202 which form channels between the vacuum injection tool 204 and the PCB wafer 200. An epoxy resin, for example, is injected into the channels 202 via conduits 205 and subsequently is cured (i.e., hardened) thermally and/or by applying UV radiation. Preferably, the epoxy resin has low water-absorption (e.g., <0.1% water absorption) after it is cured. The tool 204 is removed from the resulting structure 206 (FIG. 2C) in which the cured resin forms overmolds 50 that encase the wiring 36.

Figure 2D:
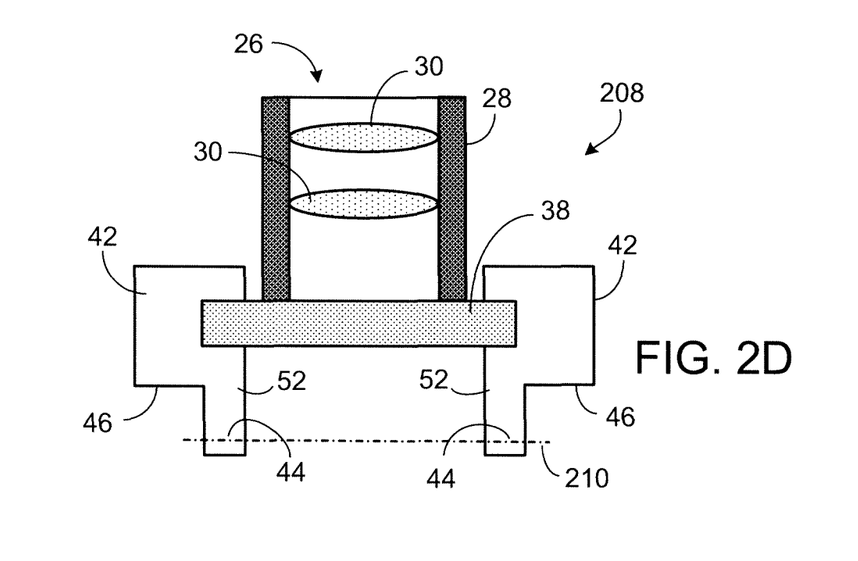

Next, optical assemblies (e.g., optical assembly 208 of FIG. 2D) are prepared for attachment to the structure 206. In this example, the optical assembly 208 includes a lens stack 26 having lenses 30 held in place by a lens barrel 28. The lens barrel 28 is fixed to a transparent plate 38, whose side edges are embedded within a spacer 42 that laterally surrounds the transparent plate 38. Prior to attaching each optical assembly 208 to the PCB wafer 200 and a respective one of the image sensor dies 32, the focal length of the optical assembly 208 can be measured. The height of the height-defining portion 52 of the spacer 42 can be adjusted (e.g., by machining indicated by the horizontal dashed line 210 in FIG. 2D) in accordance with a desired height. In some instances, the height-defining portion 52 of the spacer 42 can be adjusted (e.g., by machining) to correct for tilt in the optical assembly 208.

Figure 2E:
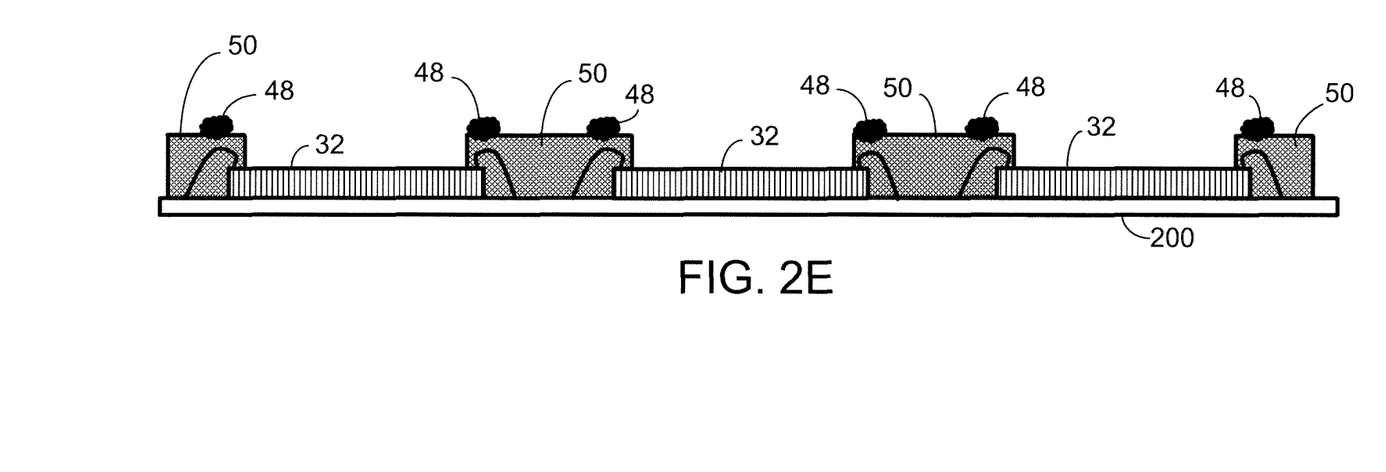
Figure 2F:
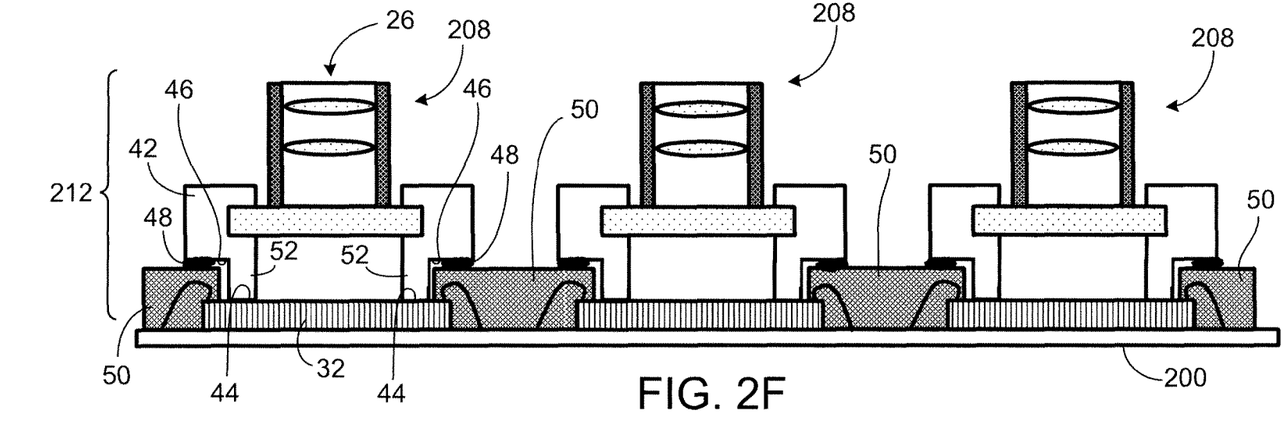
Figure 2G:
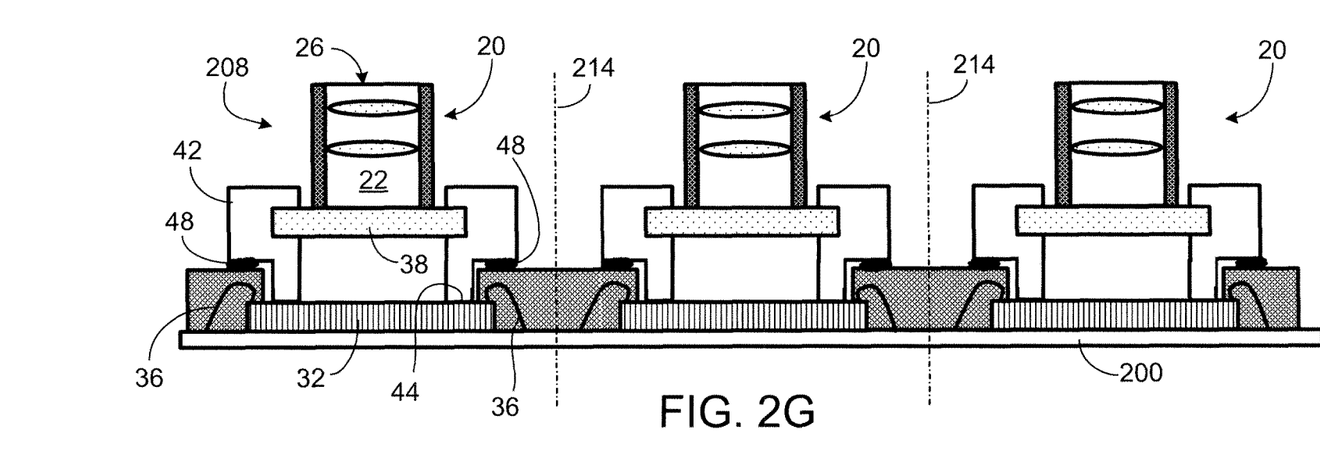

When the optical assemblies 208 are ready for attachment to the structure 206, a small amount of adhesive 48 is injected or otherwise provided on the upper surface of the overmolds 50 (see FIG. 2E). Next, a singulated optical assembly 208 is positioned over each respective one of the image sensor dies 32 such that the height-defining surface 44 is in direct contact with the upper surface of the die 32 and such that the bonding surface 46 is fixed to the overmold 50 by way of the adhesive 48. After curing the adhesive 48 thermally and/or by UV radiation, the resulting structure 212 is separated (e.g., by dicing) along vertical lines 214 into singulated modules 20 (see FIG. 2G).

FIGS. 3A-3F illustrate steps in another wafer-level fabrication process for making optoelectronic modules. This process of FIGS. 3A-3F can be used to make modules either with, or without, a transparent cover 38 disposed between the image sensor 32 and the passive optical elements (e.g., lenses) 30. Among other features described below in the process of FIGS. 3A-3F is a cushion-type layer 307 between the mold and the image sensor. The cushion-type layer 307 can alleviate a potential mold flash problem, in which resin squeezes out of the mold in a region in direct contact with the image sensor. The cushion-type layer also can help prevent the mold from damaging the image sensor even if the mold tool 304 is made of a particularly hard material such as stainless steel and even if processing occurs at considerable pressure (e.g., 30 tons of pressure distributed over the entire mold tool).

Figure 3A:
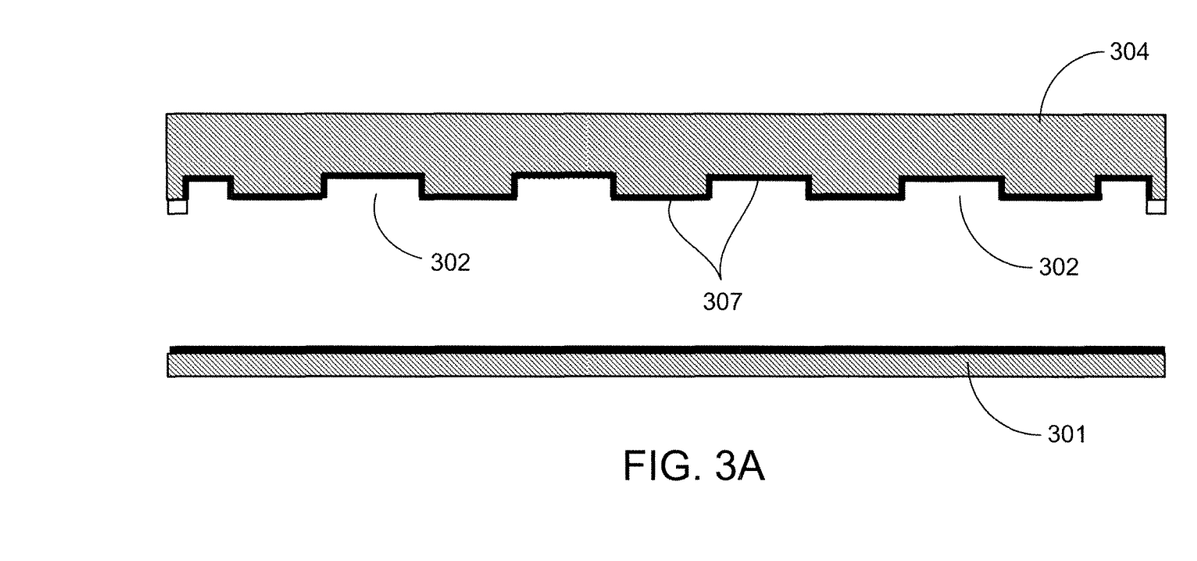
FIGS. 3A-3F illustrate steps in another wafer-level fabrication process for making optoelectronic modules.

As shown in FIG. 3A, a first substrate tool 301 and a second mold tool 304 are provided. The substrate tool 301 includes tape 303 on its upper side, to facilitate holding a substrate (e.g., PCB wafer) in place thereon. The mold tool 304 includes cavities 302 that provide channels for the formation of the resin overmolds.

The lower surface of the mold tool 304 includes a cushion-type layer 307, such as a thin film having a thickness, for example, on the order of 25 µm, 50 µm, or in some cases 100 µm. The thickness may differ in other implementations. A particular example of the film for the cushion-type layer 307 is tetrafluoroethylene-ethylene copolymer. For example, Fluon ETFE Film, available from EQX Materials SDN BDH, is suitable as the thin film in some cases and has the following properties (including tensile strength, elongation, anti-cracking, flexural modulus):

Other films and/or coatings with similar or different properties can be used as well. Further, in some implementations, gloss- and/or matte-type versions can be used. Matte-type versions can provide a textured surface for better adhesion in some cases.

In some instances, before the cushion-type layer 307 is applied to the surface of the mold tool 304, a wax or other conditioning spray is sprayed onto the mold tool. The cushion-type layer 307 then is placed on top of the wax or conditioning spray. After completion of the molding process, the wax or conditioning spray facilitates easy removal of the cushion-type layer 307 from the mold tool 304. Further, the cushion-type layer 307, which is applied as a sheet, is more easily removed from the image sensors 32 than some other types of coatings.

Figure 3B:
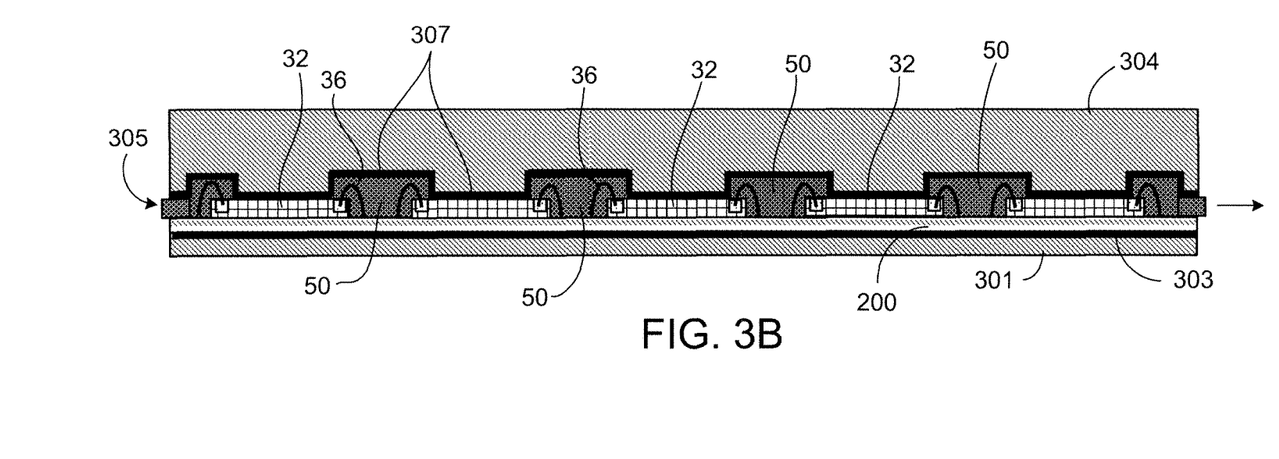

A PCB wafer 200 is loaded onto the substrate tool 301 such that the bottom surface of the PCB wafer is in contact with the tape 303 (see FIG. 3B). The PCB wafer 200 has multiple image sensor dies 32 mounted on its surface. Wiring bonds 36 provide electrical connection between the dies 32 and the PCB wafer 200.

Next, as indicated by FIG. 3B, the mold tool 304 and the substrate tool 301 are brought into contact with one another. The cushion-type layer 307 contacts the upper surface of the image sensors 32 and, as mentioned above, can help prevent damage to the surface of the image sensors. Wiring overmolds 50 are formed by a vacuum injection technique. For example, a molding resin can be injected into the cavities 302 via conduits 305. In some instances, the cavity tool and substrate tool assembly, as well as the molding resin, can be heated prior to introducing the molding resin into the cavities 302. Further, pressure can be applied as well. The molding resin then is introduced into the cavities 302 via the conduits 305. In some implementations, as a result of a chemical reaction, the molding resin becomes solid even though it has not yet cooled down. In some instances, thermal or UV curing may be performed to harden the molding resin.

After the molding resin has hardened, the PCB substrate structure 310 (see FIG. 3D) is removed from the molding tool and substrate tool assembly. The PCB substrate structure 310 includes the tape 303, the PCB substrate 200, the image sensors 32, and the wiring overmolds 50. Here too, the overmolds 50 can be composed of low water-absorption resin (e.g., <0.1% water absorption). The overmolds 50 can help safeguard the wiring 36 from mechanical failures. Preferably, the low water-absorption resin is substantially nontransparent to light (e.g., opaque to light having the same

|  | terms | standard | unit | AFLEX-LM | AFLEX |
|---|---|---|---|---|---|
| Physical properties | Melt index | ASTM-D3159 | g/10 min | 10~20 | 12 |
|  | Specific gravity | ASTM-D792 | — | 1.78 | 1.74 |
|  | Melting point | DSC | ° C. | 225 | 260 |
|  | 10% weight loss | TGA | ° C. | 410 | 390 |
|  | Oxygen index | ASTM-D2863 | VOL % | 40 | 31 |
|  | Flammability | UL94V | — | V-0 | V-0 |
| Mechanical properties | Tensile strength | ASTM-D638 | MPa | 43 | 46 |
|  | Elongation | ASTM-D638 | % | 380 | 430 |
|  | ※ Heat aging | ASTM-D638 | % | 90 | 85 |
|  | ※ Heat aging | ASTM-D638 | % | 120 | 110 |
|  | Anti cracking | ASTM-D1693 | — | excellent | good |
|  | Flexural modulus | ASTM-D790 $10^3$ HZ | Kg/cm$^2$ | 6600 | 9000 |
| Electrical properties | Dielectric constant | ASTM-D150 $10^3$ HZ | — | 2.4 | 2.5 |
|  |  | ASTM-D150 $10^3$ HZ | — | 2.4 | 2.5 |
|  | Dielectric constant(tan δ) | ASTM-D150 $10^3$ HZ | — | 0.0007 | 0.0007 |
|  |  | ASTM-D150 $10^3$ HZ | — | 0.0082 | 0.0080 |

※ after 200° C. 96 hrs (1) retention of tensile strength (2) retention of elongation wavelength(s) of light that the image sensor is sensitive to). The low water-absorption resin permits the overmolds 50 to be dimensionally stable even when subject to relatively high temperatures, such as may be used during reflow processes.

Figure 3C:
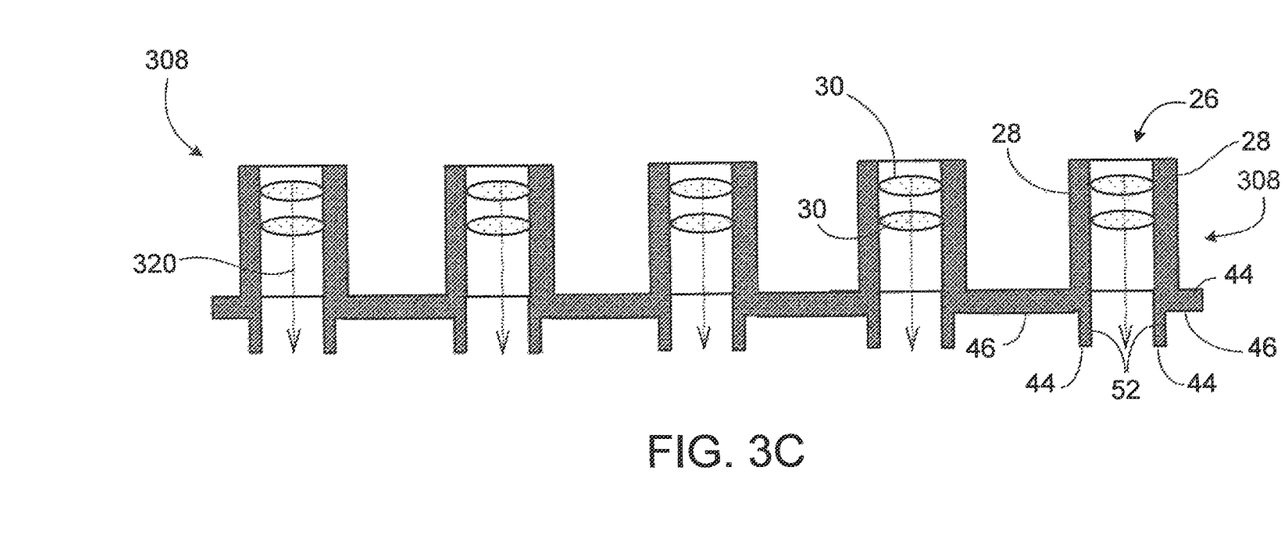

Optical assemblies 308 also are prepared. As shown in FIG. 3C, each optical assembly 308, includes a lens stack 26 having lenses 30 held in place by a lens barrel 28. The lens barrel 28 is attached to a spacer 42. Prior to attaching each optical assembly 308 to the PCB wafer 200 and to a respective one of the image sensor dies 32, the focal length of the optical assembly 308 can be measured. The height of the height-defining portion 52 of the spacer 42 can be adjusted (e.g., by micromachining), if needed, in accordance with a desired height so as to achieve a desired focal length (indicated by arrow 320). In some instances, the height-defining portion 52 of the spacer 42 also can be adjusted (e.g., by machining) to correct for tilt in the optical assembly 308.

The optical assemblies 308 can be fabricated, for example, as part of a wafer-level process. In that case, the optical assembly structure of FIG. 3C is separated (e.g., by dicing) into individual singulated optical assemblies 308.

Figure 3D:
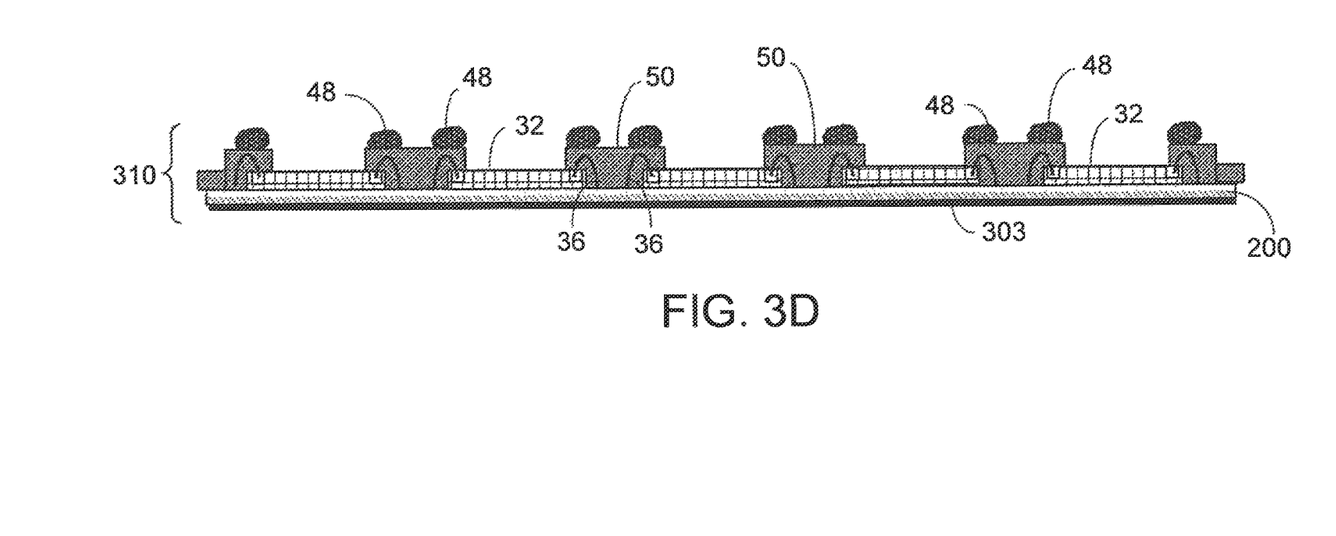
Figure 3E:
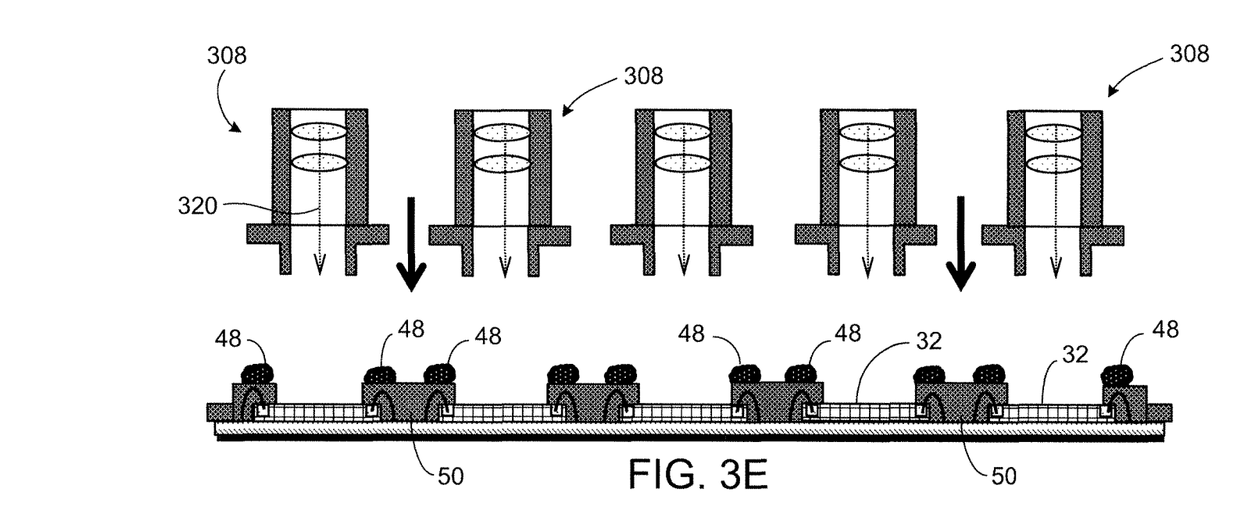
Figure 3F:
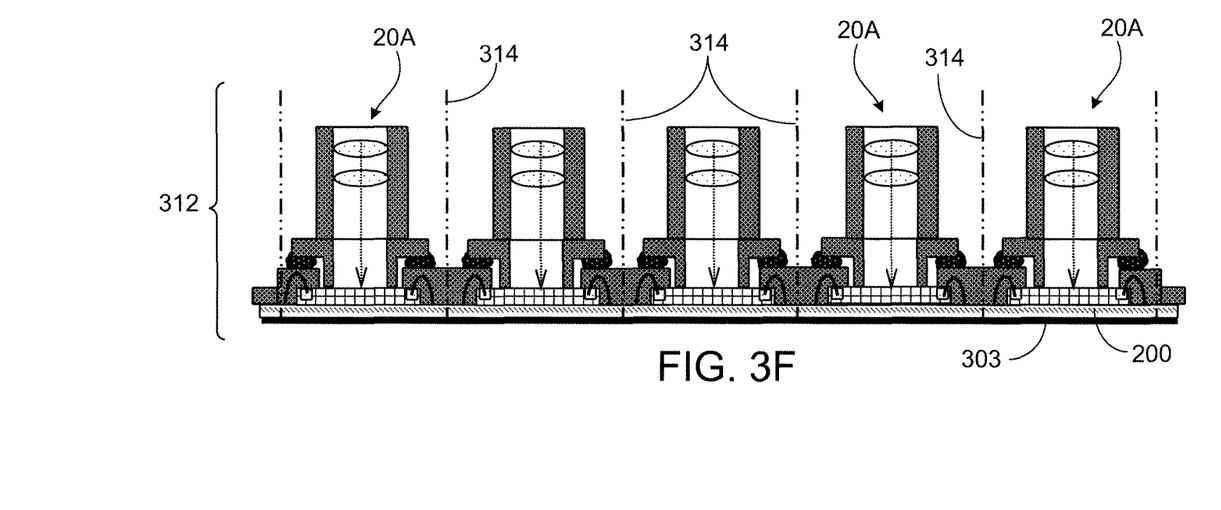

When the optical assemblies 308 are ready for attachment to PCB substrate, a small amount of adhesive 48 is injected or otherwise provided on the upper surface of the overmolds 50 (see FIG. 3D). Next, a singulated optical assembly 308 is positioned over each respective one of the image sensor dies 32 such that the height-defining surface 44 is in direct contact with the upper surface of the die 32 and such that the bonding surface 46 is fixed to the overmold 50 by way of the adhesive 48 (see FIGS. 3E and 3F). After curing the adhesive 48 thermally and/or by UV radiation, the resulting structure 312 is separated (e.g., by dicing) along vertical lines 314 into singulated modules 20A, an example of which is illustrated in FIG. 4.

Figure 4:
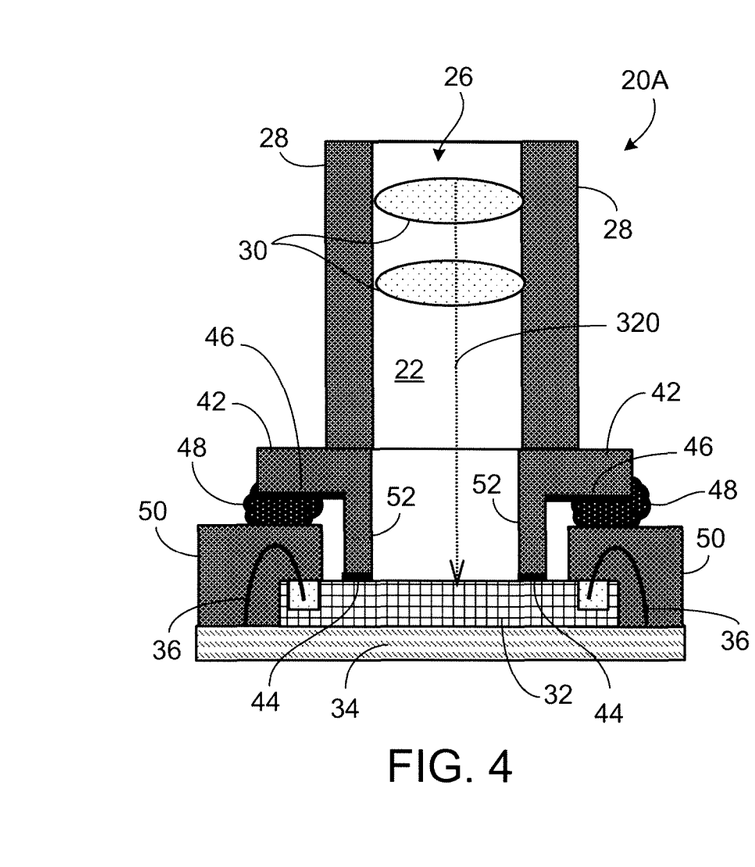
FIG. 4 illustrates an example of an optoelectronic module resulting from the process of FIGS. 3A-3F.

The example of FIG. 4 does not include a transparent cover 38 disposed between the image sensor 32 and lens stack 26 as in FIG. 1. Further, in contrast to the module 20 of FIG. 1 in which the lens barrel 28 is supported directly by the transparent substrate 38, the lens barrel 28 of the module 20A of FIG. 4 is supported directly by the spacer 42.

Figure 5:
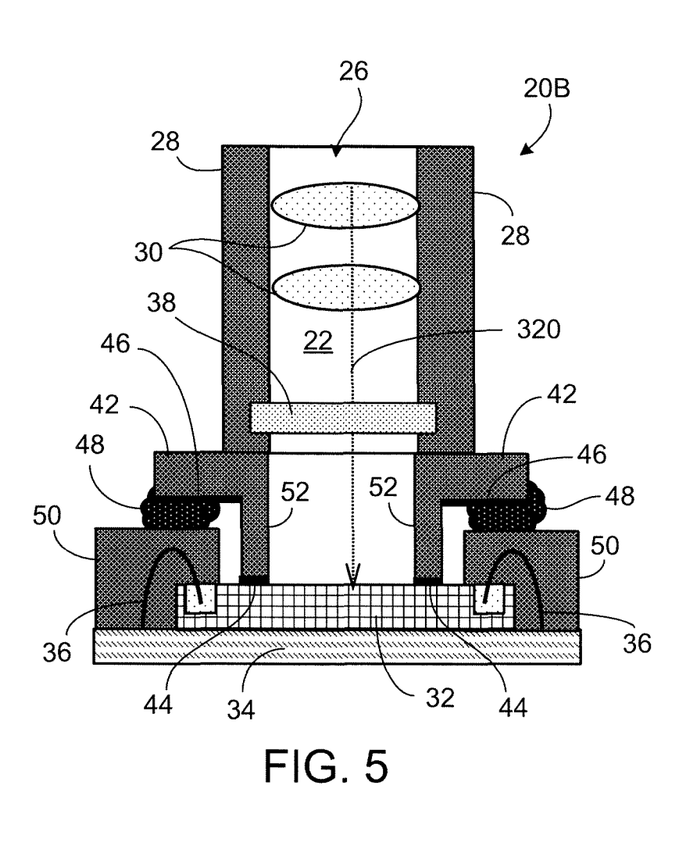
FIGS. 5, 6 and 7 illustrate other examples of optoelectronic modules including an overmold.

In some implementations, a wafer-level process like that of FIGS. 3A-3F can be used to fabricate modules that include a transparent cover 38 disposed between the image sensor 32 and lens stack 26. An example of such a module 20B is illustrated in FIG. 5. As in the example of FIG. 4, the module 20B of FIG. 5 includes a lens barrel 28 that is supported directly by the spacer 42. The transparent cover 38 is embedded laterally, and held in place, by the lens barrel 28. The transparent cover 38 can be used, for example, as a support (from above or below) for focal-length correction layers, and/or optical filter layers. In implementations without the transparent cover 38, optical filters can be disposed at another position in the lens barrel 28 or on the image sensor 32.

Figure 6:
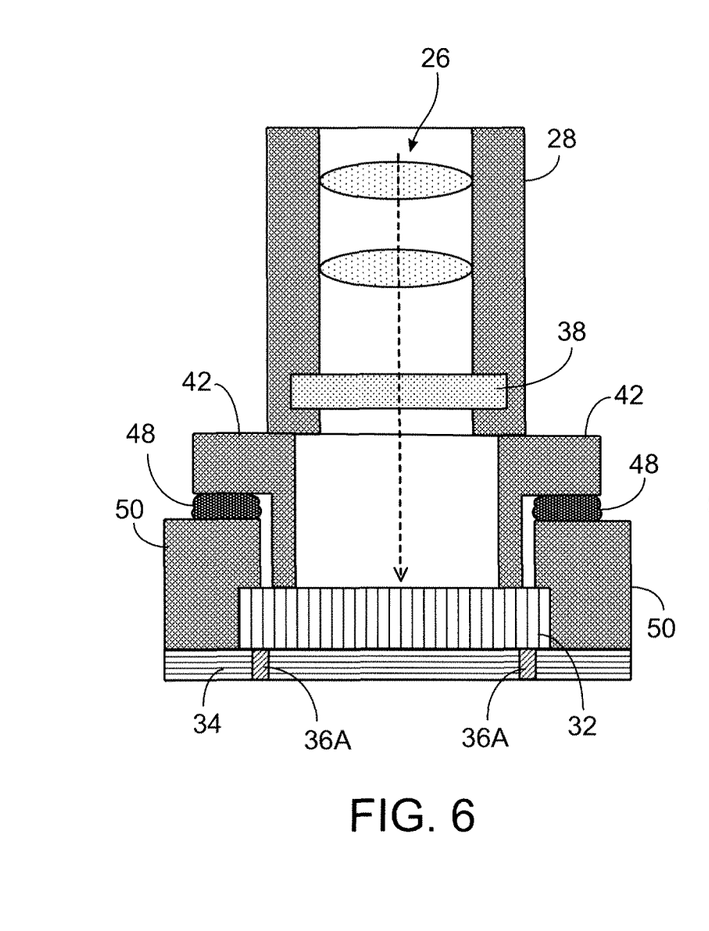
Figure 7:
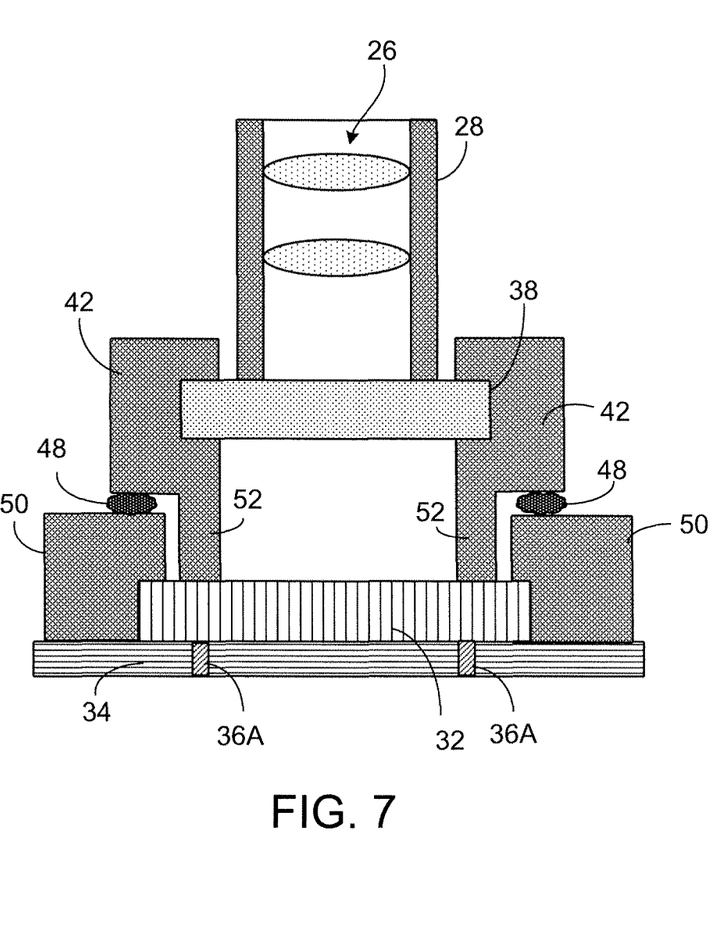

In the foregoing examples of FIGS. 1, 4 and 5, the electrically conductive connections between the image sensor 32 and the PCB 34 are formed of wiring 36. In some implementations, however, the electrically conductive connections can be provided using other technologies, such as flip chip or through substrate vias 36A, as illustrated in the examples of FIGS. 6 and 7. Although the overmold 50 in such cases is not needed to protect the electrically conductive connections 36A, the overmold still can be advantageous because it helps enhance the structural integrity of the module.

Figure 8:
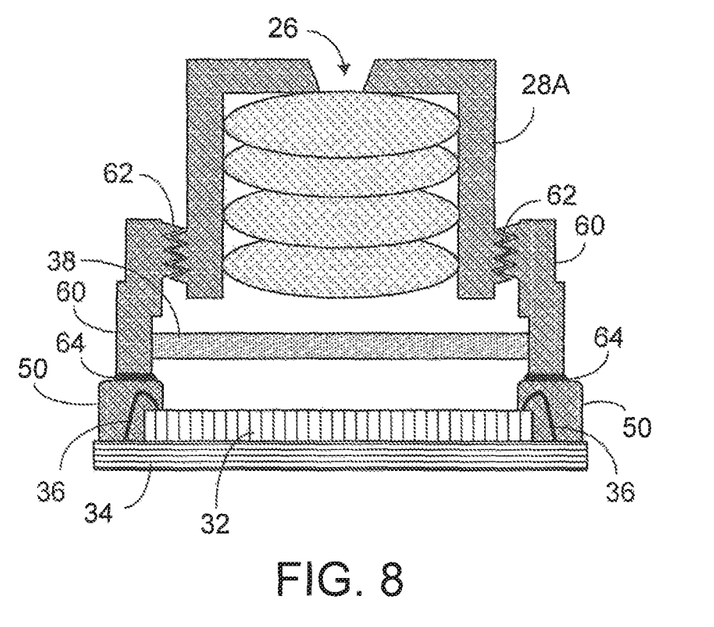
FIGS. 8 and 9 illustrate yet further examples of optoelectronic modules including an overmold.

In the foregoing examples of FIGS. 1, 4, 5, 6 and 7, the height-defining portion 52 of the spacer 42 is used to establish a precise specified distance between the image sensor 32 and the optical elements 30 in the optical assembly. In some implementations, other means can be used to establish a precise specified distance between the image sensor and the optical elements. For example, as shown in FIG. 8, the optical assembly can include a threaded lens barrel 28A operable to adjust the distance between the image sensor 32 and one or more optical elements 30 in the optical assembly. Further, as shown in FIG. 9, in some cases, the optical assembly includes an autofocus lens barrel 28B operable to adjust the distance between the image sensor 32 and one or more optical elements 30 in the optical assembly.

In the example of FIG. 8, the lens barrel 28A engages an optical assembly housing 60 by way of threads 62 to facilitate adjustment of the distance between the image sensor 32 and the optical elements 30 in the optical assembly. In this case, the housing 60 is attached to the optical assembly-side surface of the overmold 50 by epoxy or other adhesive 64. The module can be used, for example, as a fixed focus camera. In some cases, the module includes an infrared (IR)-cut optical filter.

Figure 9:
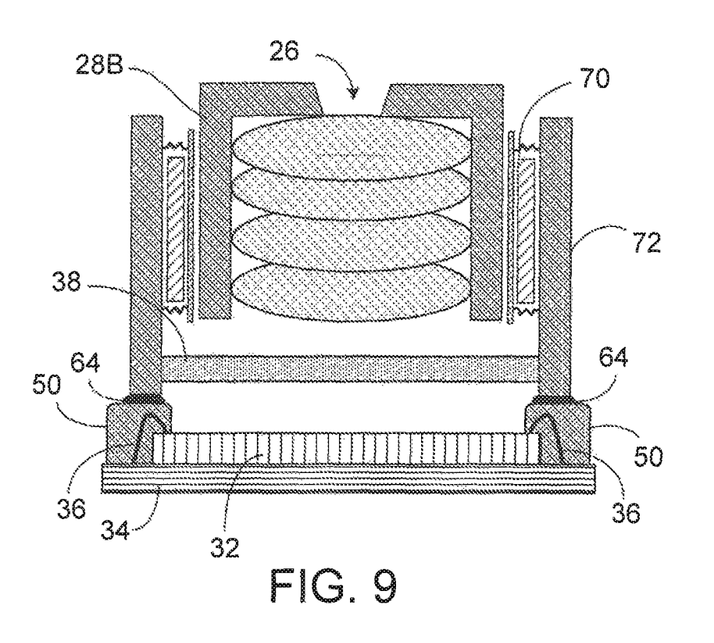

In the example of FIG. 9, the lens barrel 28B is coupled to an optical assembly housing 72 by way of an autofocus actuator 70, which can be implemented, for example, as a voice coil motor. In other instances, the autofocus actuator 70 can operate using magnetic and/or piezoelectric components. The actuator 70 facilitates adjustment of the distance between the image sensor 32 and the optical elements 30 in the optical assembly. In this case as well, the housing 72 is attached to the optical assembly-side surface of the overmold 50 by epoxy or other adhesive 64. The module can be used, for example, as an autofocus camera.

Figure 10A:
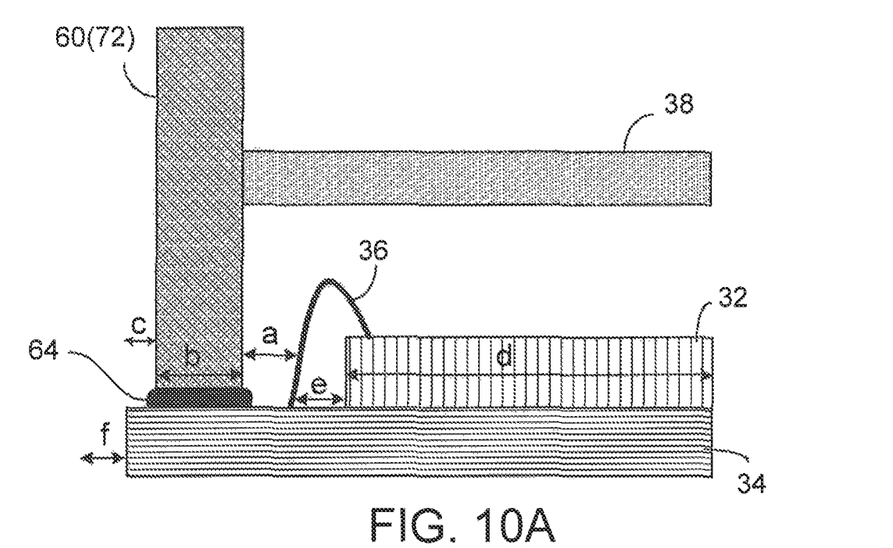
FIG. 10A illustrates examples of dimensions for an optoelectronic module without an overmold.
Figure 10B:
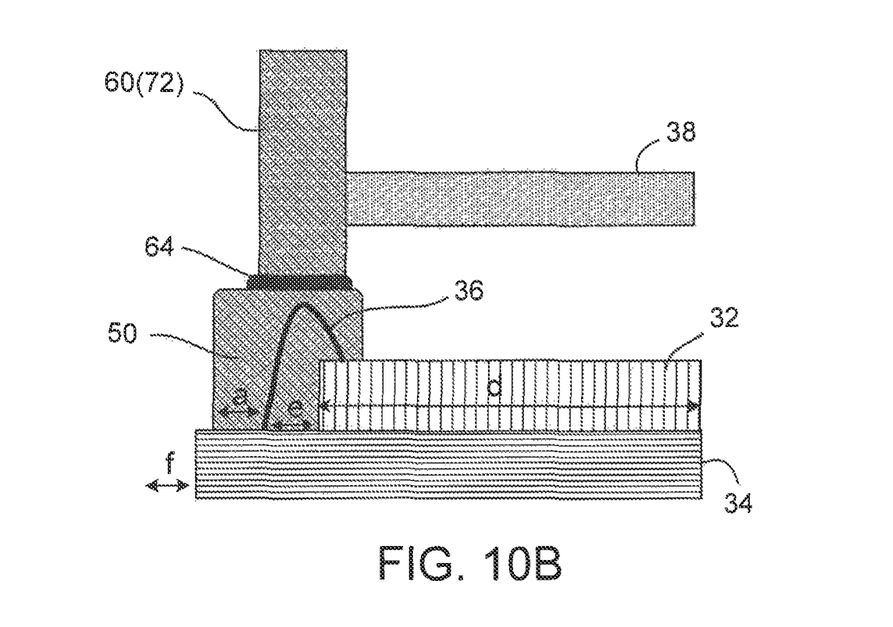
FIG. 10B illustrates examples of dimensions for an optoelectronic module with an overmold.

FIGS. 10A and 10B illustrate various dimensions that impact the footprint of two different modules having the same dimension (i.e., width "d") for the image sensor 32. The module of FIG. 10B includes an overmold 50, whereas the module of FIG. 10A does not. Instead, in the module of FIG. 10A, the housing 60 (or 72) is attached to the PCB 34. The overall lateral dimensions (i.e., X-Y) of the module in FIG. 10B depend on the molding tolerance ("a"), the sensor size ("d"), the distance ("e") from the sensor edge to the bond pad, and (for a wafer-level process) the singulation tolerance ("f"). In contrast, the overall lateral dimensions of the module in FIG. 10A depend on those factors, as well as the wire attach tolerance, the housing wall thickness ("b") and the housing X-Y dimension tolerance ("c"). The result is that a module incorporating an overmold 50 can help reduce the overall footprint (i.e., X-Y dimensions) of the module. For multi-array cameras, the reduction in size can be significant.

Various molding resins are suitable for use in the foregoing fabrication techniques. A specific example of the molding resin is MULTI-AROMATIC RESIN such as EME-G760 Type L (available from Sumitomo Bakelite Co.), which can provide the following properties:

| ITEM | TEST METHOD | UNIT | VALUES |
|---|---|---|---|
| SPIRAL FLOW | SB-U-03-003 | cm | 210 |
| GEL TIME (at 175° C.) | SB-U-03-005 | sec | 45 |
| THERMAL EXPANSION ∝1 | SB-U-02-002 | ×10⁻⁵ 1/° C. | 0.9 |
| THERMAL | SB-U-02-002 | ×10⁻⁵ 1/° C. | 4.9 |

-continued

| ITEM | TEST METHOD | UNIT | VALUES |
|---|---|---|---|
| EXPANSION ∝2 | | | |
| Tg | SB-U-02-002 | ° C. | 150 |
| THERMAL CONDUCTIVITY | SB-U-02-004 | W/m · ° C. | $94 \times 10^{-2}$ |
| FLEXURAL STRENGTH | SB-U-01-001 | N/mm² | |
| (at 25° C.) | | | 170 |
| (at 260° C.) | | | 21 |
| FLEXURAL MODULUS | SB-U-01-002 | ×10² N/mm² | |
| (at 25° c.) | | | 260 |
| (at 260° C.) | | | 8.0 |
| SPECIFIC GRAVITY | SB-U-03-018 | — | 2.00 |
| VOLUME RESISTIVITY (at 150° c.) | SB-U-00-004 | Ω - cm | $1 \times 10^{12}$ |
| UL FLAME CLASS | SB-U-03-003 | UL-94 | V-0 |
| WATER ABSORPTION (boiling, 24 h) | SB-U-03-002 | % weight gain | 0.17 |
| EXTRACTED Na⁺ | SB-U-04-043 | ppm | 1 |
| EXTRACTED Cl⁻ | SB-U-04-043 | ppm | 5 |

Other resins can be used as well.

As indicated above, in some instances, it is advantageous to use a cushion-type layer 307 with a rough textured surface. The roughness is imparted to the upper surfaces of the overmolds 50 on which the adhesive 48 is applied. The rough textured surface of the overmold 50 provides more surface area for the adhesive 48, resulting in better adhesion of the adhesive to the overmold.

In some implementations, a microlens array is disposed on the image sensor 32. Even in such situations, it can be advantageous to fabricate the modules using a mold tool 304 that includes cushion-type layer 307 so as to prevent or reduce the likelihood of damage to the microlens array.

The modules described here can be used, for example, as compact digital cameras that can be integrated into various types of consumer electronics and other devices such as mobile phones, smart phones, personal digital assistants (PDAs) and laptops.

Some or all of the foregoing features may not be present in some implementations. Further, various features described in connection with different ones of the foregoing examples can be combined in a single implementation. Also, various modifications within the spirit of the invention will be readily apparent to one of ordinary skill. Accordingly, other implementations are within the scope of the claims.

What is claimed is:

1. An optoelectronic module comprising:
   an image sensor mounted on a substrate;
   electrical connections coupling the image sensor to electrical contacts on the substrate;
   an overmold laterally encircling the image sensor and in contact with a side edge of the image sensor;
   an optical assembly disposed over the image sensor; and
   a spacer having:
      a first surface in direct contact with an optical assembly-side surface of the image sensor, wherein the optical assembly-side surface of the image sensor faces the optical assembly; and
      a second surface in contact, by way of adhesive, with the optical assembly-side surface of the overmold, wherein the optical assembly-side surface of the overmold faces a same direction as the optical assembly-side surface of the image sensor.

2. The optoelectronic module of claim 1 wherein the overmold partially overlaps the optical assembly-side surface of the image sensor adjacent the side edge of the image sensor.

3. The optoelectronic module of claim 1 wherein the overmold encases the electrical connections.

4. The optoelectronic module of claim 1 wherein the overmold is composed of a resin having less than 0.1% water absorption.

5. The optoelectronic module of claim 1 wherein the overmold is composed of a molding resin.

6. The optoelectronic module of claim 1 wherein the optical assembly includes a threaded lens barrel operable to adjust the distance between the image sensor and an optical element in the optical assembly.

7. The optoelectronic module of claim 1 wherein the optical assembly includes an autofocus lens barrel operable to adjust the distance between the image sensor and an optical element in the optical assembly.

8. The optoelectronic module of claim 1 wherein the second surface of the spacer is further from the optical assembly-side surface of the image sensor than is the first surface of the spacer.

9. An optoelectronic module comprising:
   an image sensor mounted on a substrate;
   electrical connections coupling the image sensor to electrical contacts on the substrate;
   an overmold encasing the electrical connections; and
   an optical assembly disposed over the image sensor, the optical assembly including:
      a first surface in direct contact with a surface of the image sensor; and
      a second surface in contact, by way of adhesive, with a surface of the overmold, wherein the surface of the overmold faces a same direction as the surface of the image sensor.

10. The optoelectronic module of claim 8 wherein the overmold partially overlaps an optical assembly-side surface of the image sensor adjacent a side edge of the image sensor.

11. The optoelectronic module of claim 9 wherein the overmold is composed of a resin having less than 0.1% water absorption.

12. The optoelectronic module of claim 9 wherein the overmold is composed of a molding resin.

13. The optoelectronic module of claim 9 wherein the second surface of the spacer is further from the surface of the image sensor than is the first surface of the spacer.

* * * * *

UNITED STATES PATENT AND TRADEMARK OFFICE
CERTIFICATE OF CORRECTION

PATENT NO. : 10,498,943 B2
APPLICATION NO. : 15/742567
DATED : December 3, 2019
INVENTOR(S) : Sai Mun Chan et al.

Page 1 of 1

It is certified that error appears in the above-identified patent and that said Letters Patent is hereby corrected as shown below:

In the Claims

Column 10, Claim 10, Line 47: replace "The optoelectronic module of claim 8" with --The optoelectronic module of claim 9--

Signed and Sealed this
Second Day of June, 2020

Andrei Iancu
*Director of the United States Patent and Trademark Office*